(12) United States Patent
Wu et al.

(10) Patent No.: US 11,431,144 B2
(45) Date of Patent: Aug. 30, 2022

(54) SUPPRESSION OF HIGHER-ORDER LASING IN A BRILLOUIN LASER USING NESTED RING RESONATORS

(71) Applicant: Honeywell International Inc., Charlotte, NC (US)

(72) Inventors: Jianfeng Wu, Tucson, AZ (US); Karl D. Nelson, Plymouth, MN (US); Matthew Wade Puckett, Phoenix, AZ (US)

(73) Assignee: Honeywell International Inc., Charlotte, NC (US)

( * ) Notice: Subject to any disclaimer, the term of this patent is extended or adjusted under 35 U.S.C. 154(b) by 0 days.

(21) Appl. No.: 17/142,929

(22) Filed: Jan. 6, 2021

(65) Prior Publication Data

US 2022/0216664 A1    Jul. 7, 2022

(51) Int. Cl.
| | |
|---|---|
| H01S 3/08 | (2006.01) |
| H01S 3/063 | (2006.01) |
| H01S 3/083 | (2006.01) |
| H01S 3/30 | (2006.01) |
| H01S 5/10 | (2021.01) |

(52) U.S. Cl.
CPC .......... *H01S 3/08018* (2013.01); *H01S 3/063* (2013.01); *H01S 3/083* (2013.01); *H01S 3/30* (2013.01); *H01S 5/1071* (2013.01)

(58) Field of Classification Search
CPC ...... H01S 3/08018; H01S 3/063; H01S 3/083; H01S 3/30; H01S 5/1071; H01S 2301/03
See application file for complete search history.

(56) References Cited

U.S. PATENT DOCUMENTS

| | | | |
|---|---|---|---|
| 6,560,246 B1 | 5/2003 | Stepanov et al. | |
| 8,848,760 B2 | 9/2014 | Vahala et al. | |
| 2007/0110453 A1* | 5/2007 | Akiyama | H04B 10/504 398/182 |
| 2008/0232409 A1* | 9/2008 | Yamazaki | G02B 6/12007 372/20 |

(Continued)

OTHER PUBLICATIONS

Kim et al., "Universal light-guiding geometry for high-nonlinear resonators having molecular-scale roughness", Sep. 30, 2019, pp. 1 through 8.

(Continued)

*Primary Examiner* — Xinning (Tom) Niu
(74) *Attorney, Agent, or Firm* — Fogg & Powers LLC

(57) ABSTRACT

An optical resonator device, which can be implemented in a Brillouin laser, comprises a first waveguide ring resonator having a first diameter, and one or more second waveguide ring resonators adjacent to the first waveguide ring resonator. The one or more second waveguide ring resonators each have a second diameter that is less than the first diameter. The one or more second waveguide ring resonators optically communicate with the first waveguide ring resonator, such that an optical signal in the first waveguide ring resonator optically couples into the one or more second waveguide ring resonators. The one or more second waveguide ring resonators is configured such that when the optical signal resonates within the first waveguide ring resonator and the one or more second waveguide ring resonators, the optical signal within the first waveguide ring resonator is suppressed.

20 Claims, 10 Drawing Sheets

(56) References Cited

U.S. PATENT DOCUMENTS

2011/0134940 A1    6/2011   Hartog
2015/0380900 A1*  12/2015   Liang .................... H01S 5/1032
                                                        385/2
2018/0358772 A1   12/2018   Puckett et al.

OTHER PUBLICATIONS

Loh et al., "Dual-microcavity narrow-linewidth Brillouin laser", Optica, Mar. 2015, pp. 225 through 232, vol. 2, No. 3, Optical Society of America.
Nelson et al., "Reducing Noise in a Ring-laser Gyro Based on Stimulated Brillouin Scattering", 2019, pp. 1 through 3, IEEE.
Puckett et al., "422 Million Q Planar Integrated All-Waveguide Resonator with a 3.4 Billion Absoprtion Limited Q and Sub-MHz Linewidth", Aug. 18, 2020, pp. 1 through 20.
Puckett et al., "Higher Order Cascaded SBS Suppression Using Gratings in a Photonic Integrated Ring Resonator Laser", CLEO, 2019, pp. 1 through 2, OSA.
Shen et al., "Microwave/Millimeter-Wave Generation Using Multi-Wavelength Photonic Crystal Fiber Brillouin Laser", Progress In Electromagnetics Research, PIER 80, 2008, pp. 307 through 320.

* cited by examiner

SUPPRESSION OF HIGHER-ORDER LASING IN A BRILLOUIN LASER USING NESTED RING RESONATORS

STATEMENT REGARDING FEDERALLY SPONSORED RESEARCH OR DEVELOPMENT

This invention was made with Government support under N66001-16-C-4017 awarded by DARPA. The Government has certain rights in the invention.

BACKGROUND

Brillouin lasers offer some of the narrowest and most stable spectral characteristics in existence, making them useful for a wide range of applications including microwave frequency generation, high performance sensing, and optical inertial rotation sensing. In many of these applications, however, it is necessary to lase at a single optical frequency, and Brillouin lasers typically exhibit higher-order lasing beyond certain power thresholds. In fiber lasers, this problem is typically addressed by incorporating fiber Bragg gratings into the resonator cavity, thereby splitting the resonances corresponding to higher-ordered Stokes waves and spectrally displacing these resonances from the Brillouin gain provided by the lower-order Stokes waves. However, no analogous technique is available for integrated photonics, which are rapidly approaching fiber optics in terms of capability for the design of Brillouin lasers.

Only a few embodiments of chip-scale Brillouin waveguides exist, and only one of these has demonstrated linewidth narrowing by suppressing higher-order lasing, making use of a Bragg grating-based suppression method. However, using Bragg gratings to suppress resonances is challenging and not entirely ideal, because any imperfections in the resonator fabrication will introduce scattering loss and cause unwanted resonance splitting. This will increase the threshold optical pump power that is required to achieve lasing, limiting the reduction to laser linewidth that can be achieved.

SUMMARY

An optical resonator device, which can be implemented in a Brillouin laser, comprises a first waveguide ring resonator having a first diameter, and one or more second waveguide ring resonators adjacent to the first waveguide ring resonator. The one or more second waveguide ring resonators each have a second diameter that is less than the first diameter. The one or more second waveguide ring resonators optically communicate with the first waveguide ring resonator, such that an optical signal in the first waveguide ring resonator optically couples into the one or more second waveguide ring resonators. The one or more second waveguide ring resonators is configured such that when the optical signal resonates within the first waveguide ring resonator and the one or more second waveguide ring resonators, the optical signal within the first waveguide ring resonator is suppressed.

BRIEF DESCRIPTION OF THE DRAWINGS

Features of the present disclosure will be apparent to those skilled in the art from the following description with reference to the drawings. Understanding that the drawings depict only typical embodiments and are not therefore to be considered limiting in scope, the embodiments will be described with additional specificity and detail through the use of the drawings, in which.

DETAILED DESCRIPTION

In the following detailed description, reference is made to the accompanying drawings, in which is shown by way of illustration various exemplary embodiments. It is to be understood that other embodiments may be utilized. The following detailed description is, therefore, not to be taken in a limiting sense.

An approach for the suppression of higher-order lasing in a Brillouin laser is described herein. In the present approach, a larger main resonator and one or more smaller resonators are placed in a nested relationship with respect to each other to form an optical resonator device for a Brillouin laser. The optical resonator device provides resonance suppression, which can be more robust to device imperfections, and can suppress higher-order lasing without substantially increasing the threshold of the 1st order stimulated Brillouin scattering (SBS). In some embodiments, the present technique can be implemented to suppress or eliminate higher-order lasing in chip-scale Brillouin lasers.

In one method of making the present optical resonator device, a chip-scale optical waveguide comprising first and second waveguide layers is formed through any of several typical chip fabrication processes. The design of the first waveguide layer includes a single larger ring resonator corresponding to the main cavity of a Brillouin laser. The design of the second waveguide layer includes one or more smaller ring resonators, each with a length much less than that of the larger ring resonator.

The resonances supported by the smaller ring resonators can be aligned such that they introduce narrow-band loss in the larger ring resonator. Multiple smaller ring resonators may be used to imprint a tailorable loss spectrum onto the larger ring resonator.

During operation of the optical resonator device, light is injected into the larger ring resonator at a wavelength corresponding to an unsuppressed resonance. The light in the larger ring resonator couples into the smaller ring resonators, and if the light resonates within these smaller ring resonators, the resonance of the larger ring resonator will be suppressed. This suppression may be exploited to inhibit higher-order lasing in a Brillouin laser. For example, the resonance corresponding to first-order Brillouin lasing can be designed to be unsuppressed, but the resonance corresponding to second-order Brillouin lasing can be designed to be suppressed.

Further details of various embodiments are described hereafter with reference to the drawings.

Figure 1A:
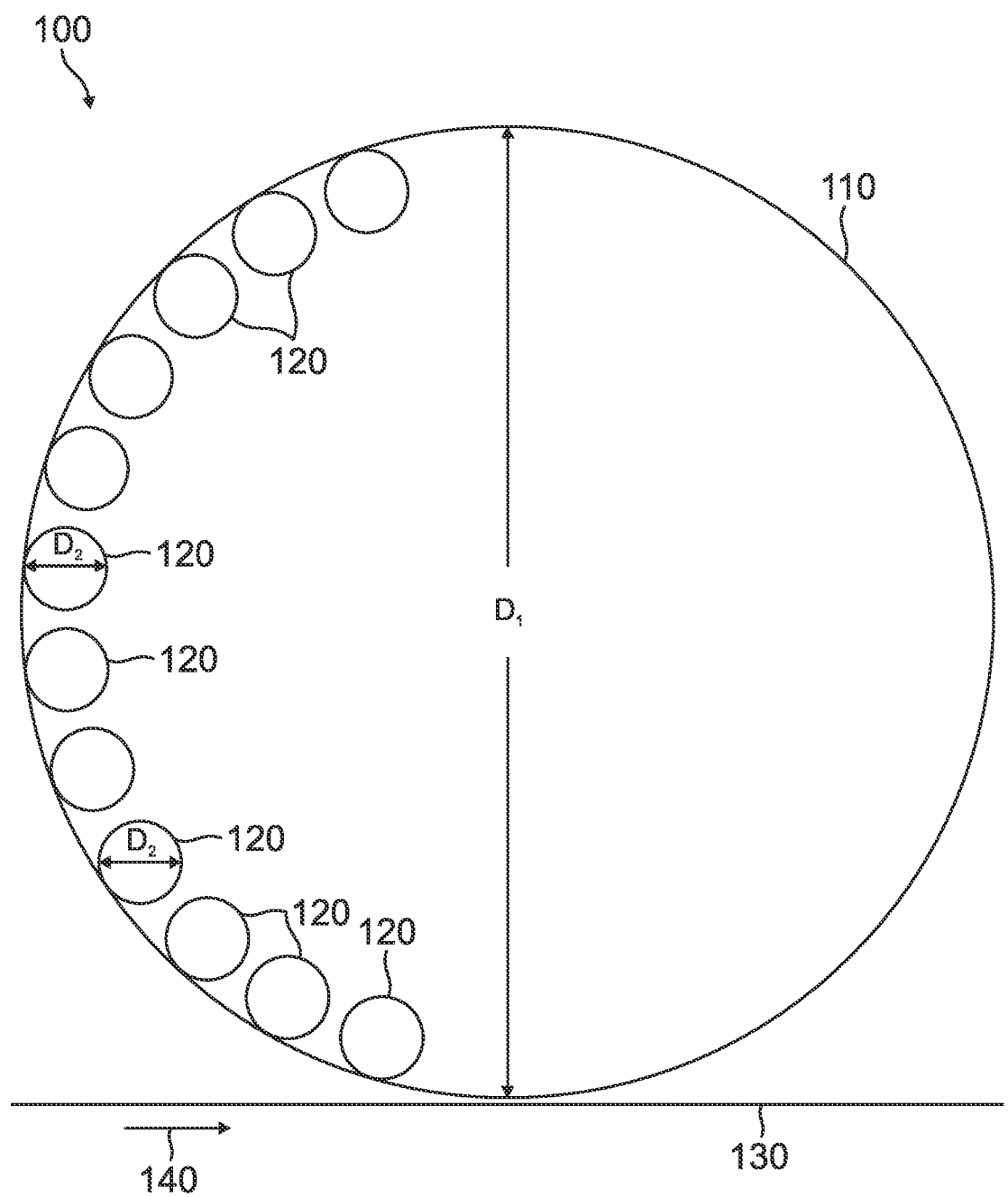
FIG. 1A is schematic plan view of an optical resonator device, according to one embodiment, which can be implemented to suppress higher-order lasing in a Brillouin laser.
Figure 1B:
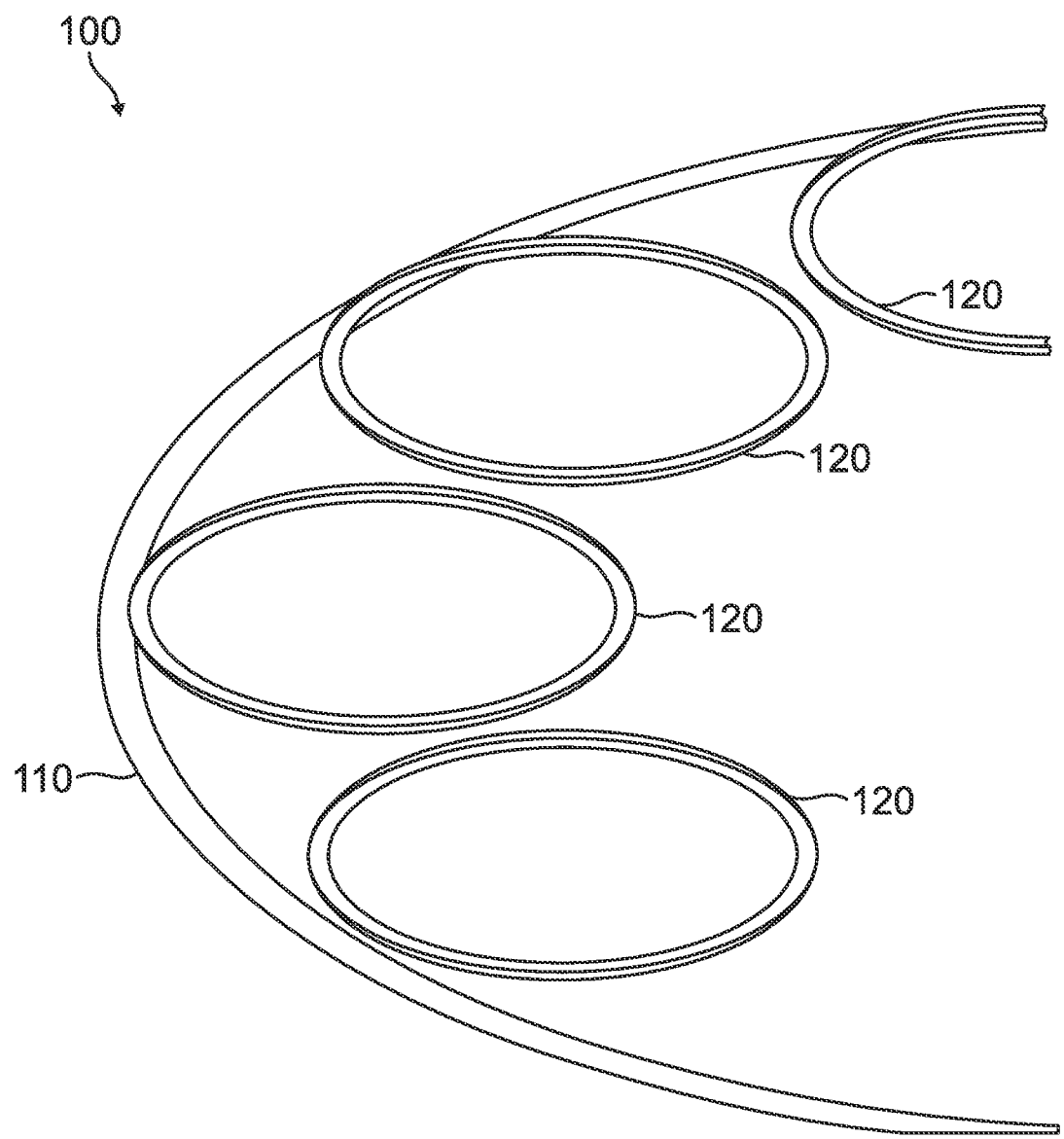
FIG. 1B is a partial perspective view of the optical resonator device of FIG. 1A.

FIGS. 1A and 1B illustrates one embodiment of an optical resonator device 100, which can be implemented to suppress higher-order lasing in a Brillouin laser. The optical resonator device 100 includes a first waveguide ring resonator 110, and a plurality of second waveguide ring resonators 120. The first waveguide ring resonator 110 has a first diameter $D_1$, and the second waveguide ring resonators 120 each have a second diameter $D_2$ that is less than the first diameter $D_1$.

As shown in FIG. 1A, first waveguide ring resonator 110 defines a perimeter, and second waveguide ring resonators 120 extend inside the perimeter. The second waveguide ring resonators 120 are positioned to optically communicate with first waveguide ring resonator 110. As depicted in FIG. 1B, second waveguide ring resonators 120 are adjacent to and separate from first waveguide ring resonator 110. In this embodiment, second waveguide ring resonators 120 are positioned above where first waveguide ring resonator 110 is positioned with respect to an underlying substrate. In an alternative embodiment, first waveguide ring resonator 110 can be positioned above where second waveguide ring resonators 120 are positioned with respect to an underlying substrate. Methods for fabricating optical resonator devices according to these alternative embodiments are described hereafter.

As shown in FIG. 1A, an optical waveguide bus 130 can be adjacent to and optically coupled with first waveguide ring resonator 110. The optical waveguide bus 130 is configured to receive an optical signal 140 from a pump source, and to couple optical signal 140 into first waveguide ring resonator 110. As second waveguide ring resonators 120 optically communicate with first waveguide ring resonator 110, optical signal 140 coupled into first waveguide ring resonator 110 optically couples into second waveguide ring resonators 120. The second waveguide ring resonators 120 are configured such that when an optical signal resonates within both first waveguide ring 110 and second waveguide ring resonators 120, a resonance of first waveguide ring resonator 110 is suppressed.

Although FIG. 1A depicts optical resonator device 100 as having twelve (12) waveguide ring resonators 120, it should be understood that more or less waveguide ring resonators 120 can be implemented, depending on the desired performance characteristics of the optical resonator device.

Figure 2:
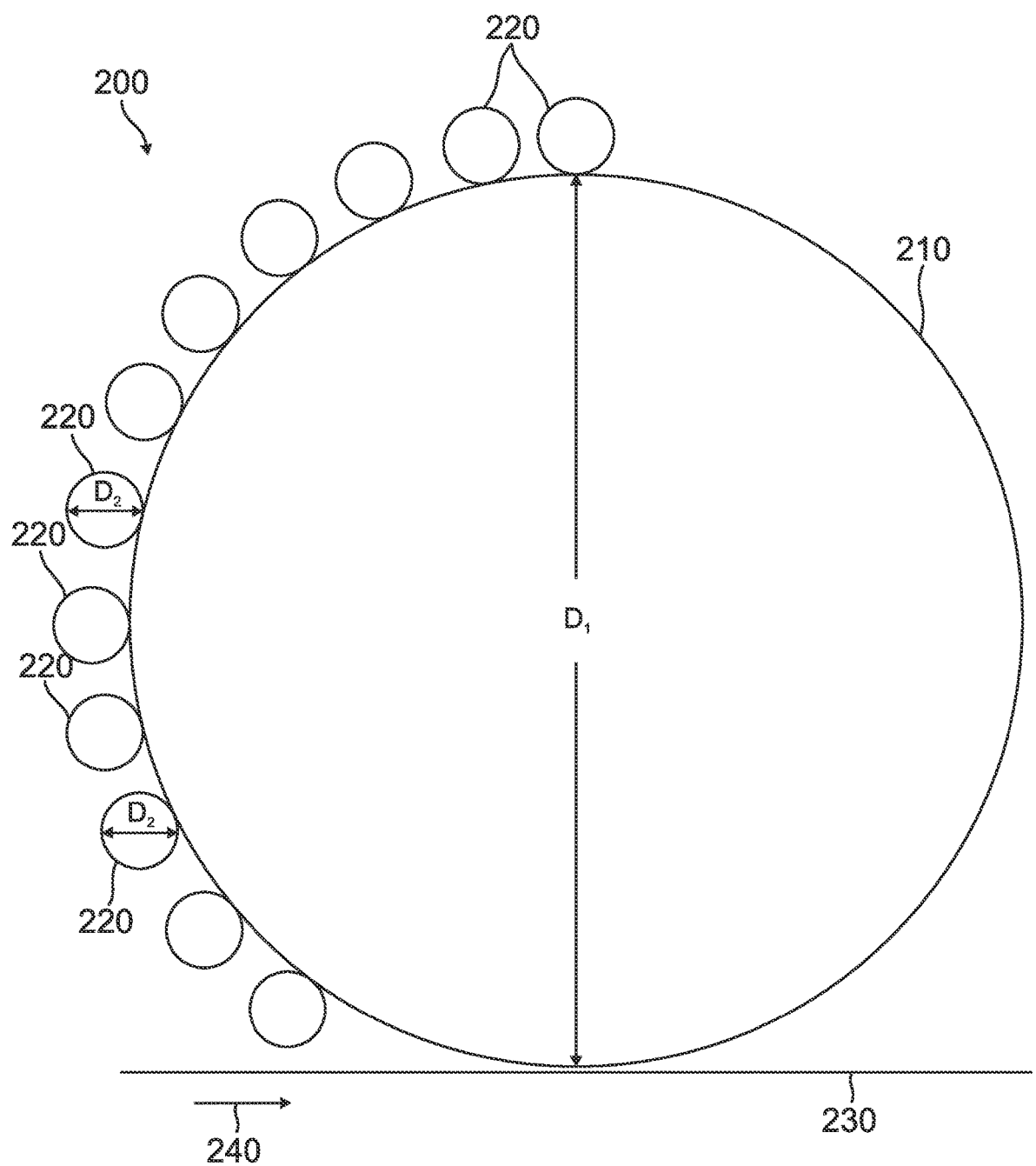
FIG. 2 is schematic plan view of an optical resonator device, according to another embodiment, which can be implemented to suppress higher-order lasing in a Brillouin laser.

FIG. 2 illustrates another embodiment of an optical resonator device 200, which can be implemented to suppress higher-order lasing in a Brillouin laser. The optical resonator device 200 includes a first waveguide ring resonator 210, and a plurality of second waveguide ring resonators 220. The first waveguide ring resonator 210 has a first diameter $D_1$, and the second waveguide ring resonators 220 each have a second diameter $D_2$ that is less than the first diameter $D_1$. As shown in FIG. 2, first waveguide ring resonator 210 defines a perimeter, and second waveguide ring resonators 120 extend outside the perimeter. The second waveguide ring resonators 220 are positioned to optically communicate with first waveguide ring resonator 210.

The second waveguide ring resonators 220 are adjacent to and separate from first waveguide ring resonator 210. In one embodiment, second waveguide ring resonators 220 can be positioned above where first waveguide ring resonator 210 is positioned with respect to an underlying substrate. In an alternative embodiment, first waveguide ring resonator 210 can be positioned above where second waveguide ring resonators 220 are positioned with respect to an underlying substrate.

As shown in FIG. 2, an optical waveguide bus 230 can be adjacent to and optically coupled with first waveguide ring resonator 210. The optical waveguide bus 230 is configured to receive an optical signal 240 from a pump source, and to couple optical signal 240 into first waveguide ring resonator 210. The optical signal 240 in first waveguide ring resonator 210 optically coupled into second waveguide ring resonators 220. The second waveguide ring resonators 220 are configured such that when an optical signal resonates within both first waveguide ring 210 and second waveguide ring resonators 220, a resonance of first waveguide ring resonator 210 is suppressed.

Although FIG. 2 depicts optical resonator device 200 as having twelve (12) waveguide ring resonators 220, it should be understood that more or less waveguide ring resonators 220 can be implemented, depending on the desired performance characteristics of the optical resonator device.

Figure 3:
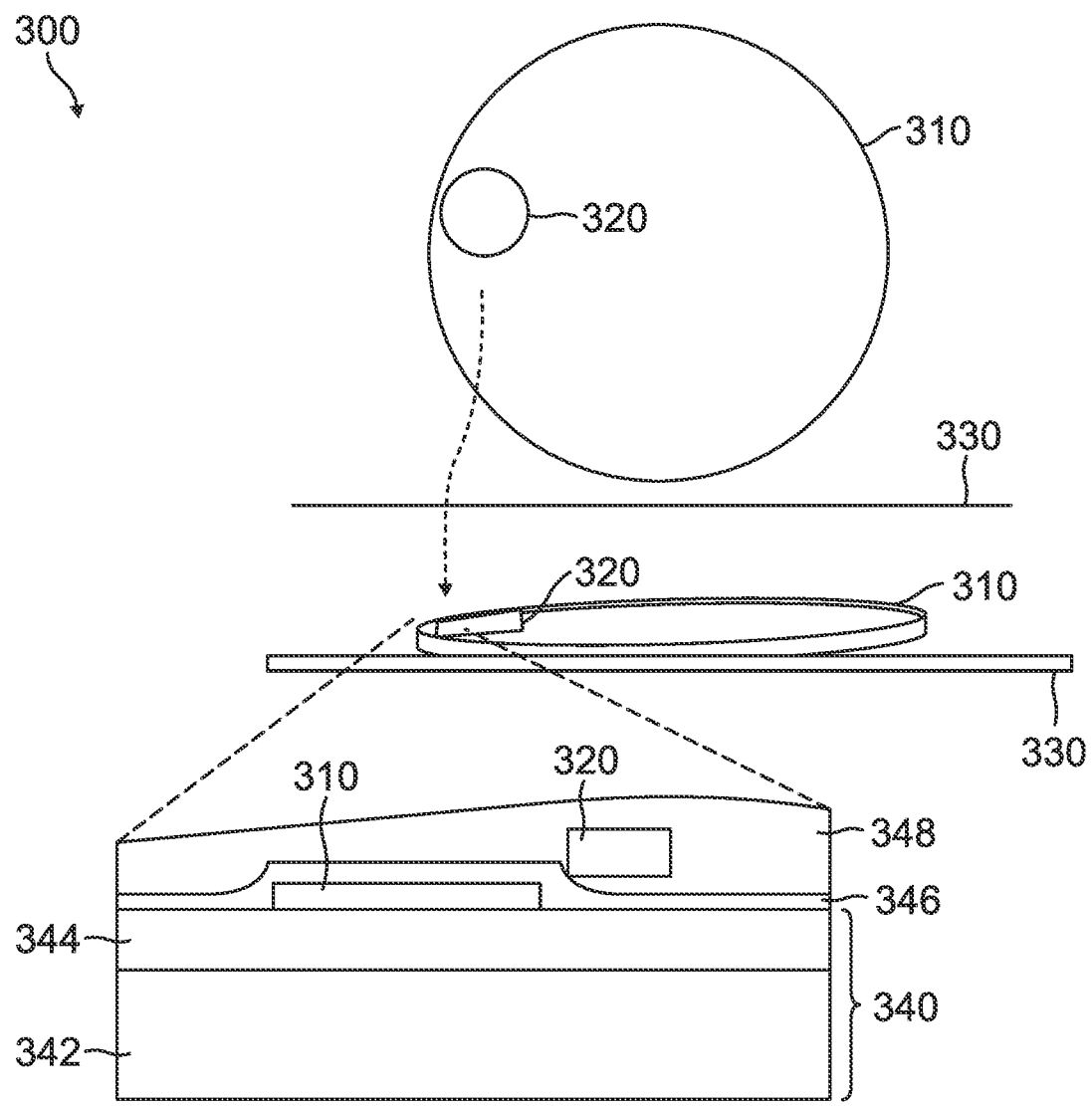
FIG. 3 illustrates various schematic views of an optical resonator device, according to a further embodiment, which can be implemented to suppress higher-order lasing in a Brillouin laser.

FIG. 3 illustrates various aspects of an optical resonator device 300, according to a further embodiment, which can be implemented to suppress higher-order lasing in a Brillouin laser. The optical resonator device 300 includes an outer waveguide ring resonator 310, and at least one inner waveguide ring resonator 320. The outer waveguide ring resonator 310 has a larger diameter and thus a longer length than inner waveguide ring resonator 320. The inner waveguide ring resonator 320 is positioned to optically communicate with outer waveguide ring resonator 310. An optical waveguide bus 330 is located adjacent to and optically coupled with outer waveguide ring resonator 310.

As further shown in FIG. 3, optical resonator device 300 is supported by an underlying substrate layer 340, which can include an underlying handle wafer 342 with a bottom cladding layer 344 thereover. The bottom cladding layer 344 supports waveguide ring resonator 310. An intermediate cladding layer 346 covers waveguide ring resonator 310 and exposed portions of bottom cladding layer 344. The waveguide ring resonator 320 is supported by intermediate cladding layer 346, such that waveguide ring resonator 320 is adjacent to and slightly above waveguide ring resonator 310. A top cladding layer 348 can optionally cover waveguide ring resonator 320 and exposed portions of intermediate cladding layer 346.

The bottom cladding layer 344, intermediate cladding layer 346, and top cladding layer 348 are composed of a lower refractive index material. The bottom cladding layer 344 can have a thickness of about 5 microns to about 10 microns; intermediate cladding layer 346 can have a thickness of about 1 micron to about 5 microns; and top cladding layer 348 can have a thickness of about 5 microns to about 10 microns. In contrast, waveguide ring resonators 310 and 320 are composed of a higher refractive index material, and can each have a thickness of about 25 nm to about 500 nm.

Figure 4:
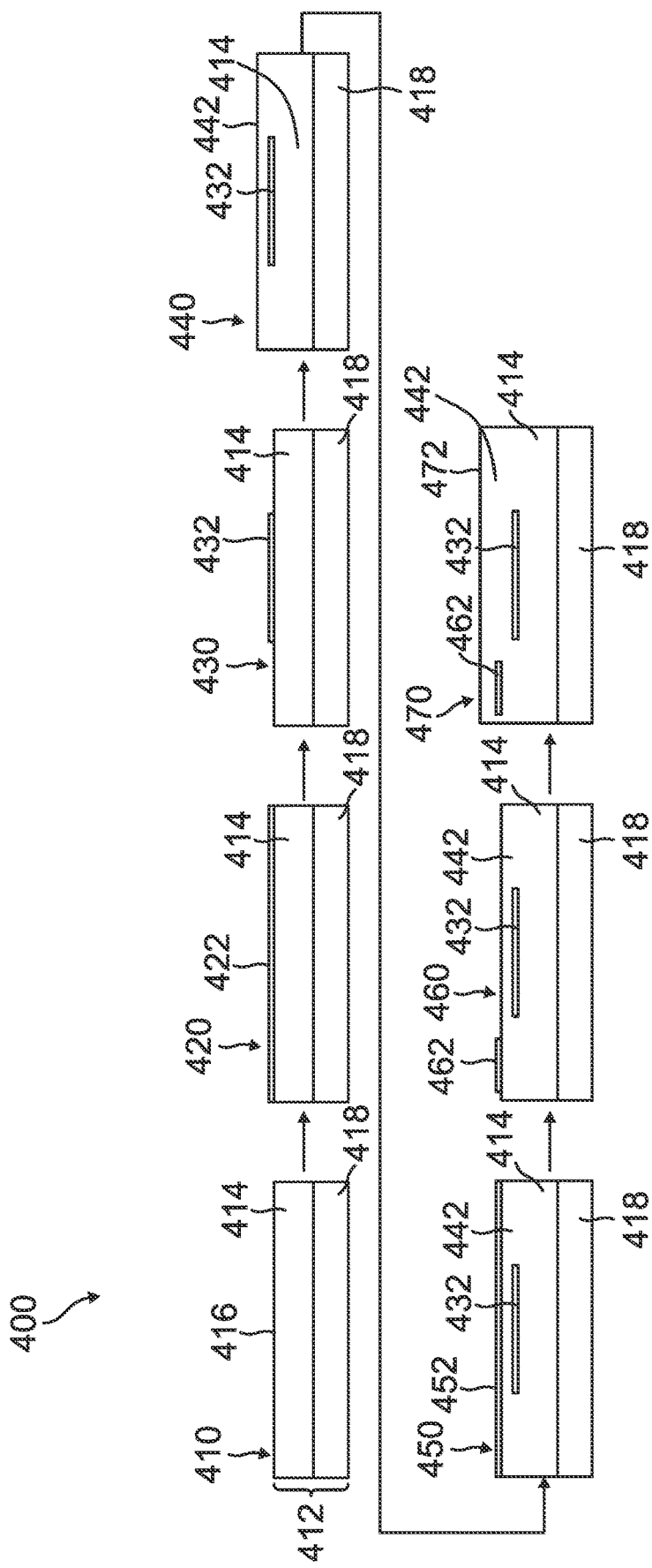
FIG. 4 depicts schematic side views of a method for fabricating an optical resonator device, according to one exemplary approach.

FIG. 4 illustrates schematic side views of a method 400 for fabricating an optical resonator device, such as those described above, according to one exemplary approach. Initially, as shown at 410, a substrate 412 is provided, such as an initial wafer, which includes a bottom cladding layer 414 with an upper surface 416. The bottom cladding layer 414 is composed of a first material having a first (lower) refractive index, such as silicon dioxide, aluminum oxide, silicon oxynitride, or the like. The substrate 412 can also include an underlying handle wafer 418, such as a silicon handle, which supports bottom cladding layer 414. The substrate 412 can be coupled to a photonics chip.

As depicted at 420, a first waveguide layer 422 is deposited on upper surface 416 of cladding layer 414, such as by a conventional deposition process. The first waveguide layer 422 includes a second material having a second (higher) refractive index that is greater than the first refractive index of the first material. For example, the second material can include silicon nitride, silicon, titanium dioxide, or the like.

Next, as shown at 430, a first (larger) waveguide ring resonator 432 is formed from first waveguide layer 422. The waveguide ring resonator 432 can be formed through standard lithography, etching, and resist removal steps. Thereafter, as shown at 440, an intermediate cladding layer 442 is deposited over waveguide ring resonator 432 and exposed portions of bottom cladding layer 414. The intermediate cladding layer 442 includes the first material having a lower refractive index.

As depicted at 450, a second waveguide layer 452 is deposited over intermediate cladding layer 442, such as by a conventional deposition process. The second waveguide layer 452 includes the second material having a higher refractive index. Next, as shown at 460, at least one second (smaller) waveguide ring resonator 462 is formed from second waveguide layer 452, with waveguide ring resonator(s) 462 having a diameter less than the diameter of waveguide ring resonator 432. The waveguide ring resonator(s) 462 can be formed through standard lithography, etching, and resist removal steps. The smaller waveguide ring resonator(s) 462 is formed to be adjacent to, and slightly above, larger waveguide ring resonator 432, such that waveguide ring resonator 432 optically communicates with waveguide ring resonator(s) 462.

In one embodiment, a plurality of waveguide ring resonators 462 is formed, such that when an optical signal resonates within (single) waveguide ring resonator 432 and waveguide ring resonators 462, a resonance of waveguide ring resonator 432 is suppressed.

Optionally, as shown at 470, a top cladding layer 472 can be formed over waveguide ring resonator(s) 462 and exposed portions of intermediate cladding layer 442, such as by a conventional deposition process, to further protect the optical resonator device. The top cladding layer 472 can again include the first material having a lower refractive index.

Figure 5:
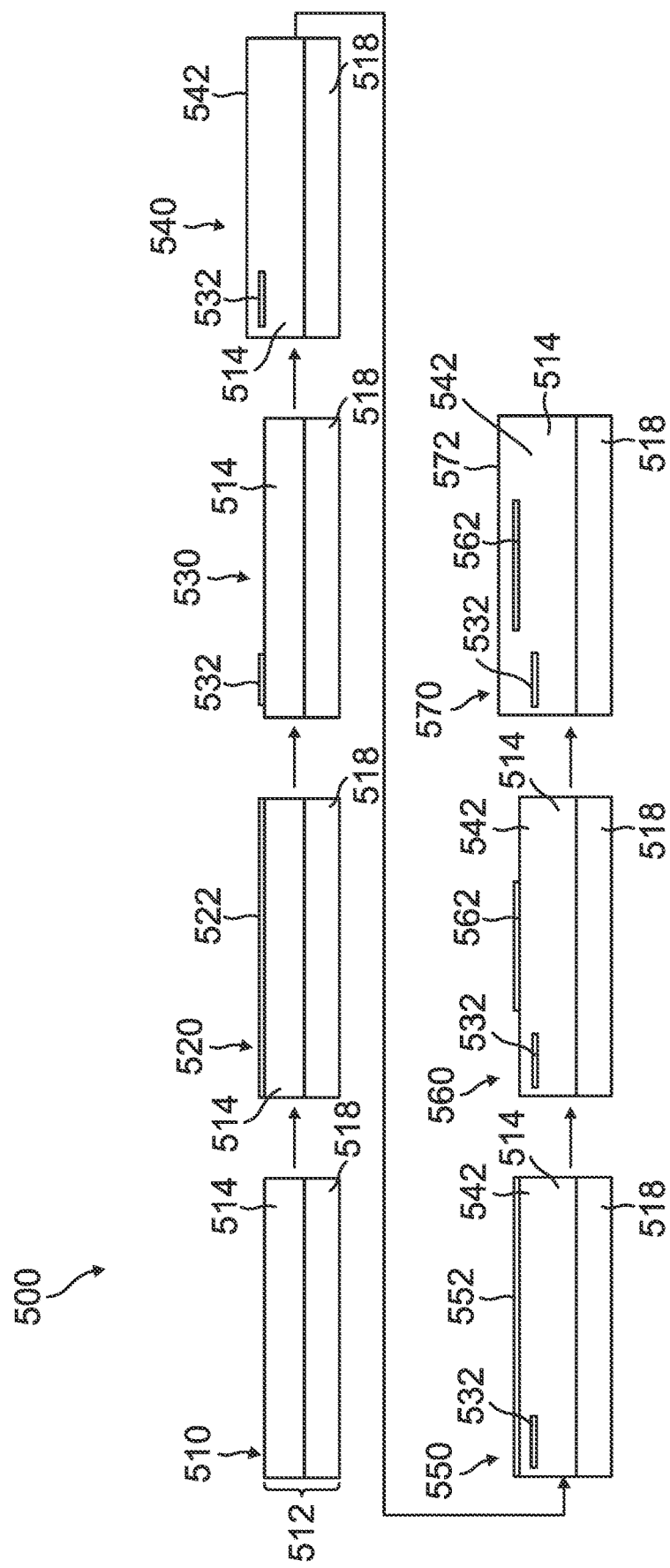
FIG. 5 depicts schematic side views of a method for fabricating an optical resonator device, according to another exemplary approach.

FIG. 5 illustrates schematic side views of a method 500 for fabricating an optical resonator device, such as those described above, according to another exemplary approach. Initially, as shown at 510, a substrate 512 is provided, such as an initial wafer, which includes a bottom cladding layer 514 that is composed of a first material having a lower refractive index. The substrate 512 can also include an underlying handle wafer 518 that supports bottom cladding layer 514. The substrate 512 can be coupled to a photonics chip.

As depicted at 520, a first waveguide layer 522 is deposited on cladding layer 514, such as by a conventional deposition process. The first waveguide layer 522 includes a second material having a higher refractive index. Next, as shown at 530, at least one smaller waveguide ring resonator 532 is formed from first waveguide layer 522. The waveguide ring resonator(s) 532 can be formed through standard lithography, etching, and resist removal steps. Thereafter, as shown at 540, an intermediate cladding layer 542 is deposited over waveguide ring resonator(s) 532 and exposed portions of bottom cladding layer 514. The intermediate cladding layer 542 includes the first material having a lower refractive index.

As depicted at 550, a second waveguide layer 552 is deposited over intermediate cladding layer 542, such as by a conventional deposition process. The second waveguide layer 552 includes the second material having a higher refractive index. Next, as shown at 560, a larger waveguide ring resonator 562 is formed from second waveguide layer 552, with waveguide ring resonator 562 having a diameter greater than the diameter of waveguide ring resonator(s) 532. The waveguide ring resonator 562 can be formed through standard lithography, etching, and resist removal steps. The waveguide ring resonator 562 is formed to be adjacent to, and slightly above, waveguide ring resonator(s) 532, such that waveguide ring resonator(s) 532 optically communicates with waveguide ring resonator 562.

In one embodiment, a plurality of waveguide ring resonators 532 formed, such that when an optical signal resonates within (single) waveguide ring resonator 562 and waveguide ring resonators 532, a resonance of waveguide ring resonator 562 is suppressed.

Optionally, as shown at 570, a top cladding layer 572 can be formed over waveguide ring resonator 562 and exposed portions of intermediate cladding layer 542, such as by a conventional deposition process, to further protect the optical resonator device. The top cladding layer 572 can again include the first material having a lower refractive index.

Figure 6:
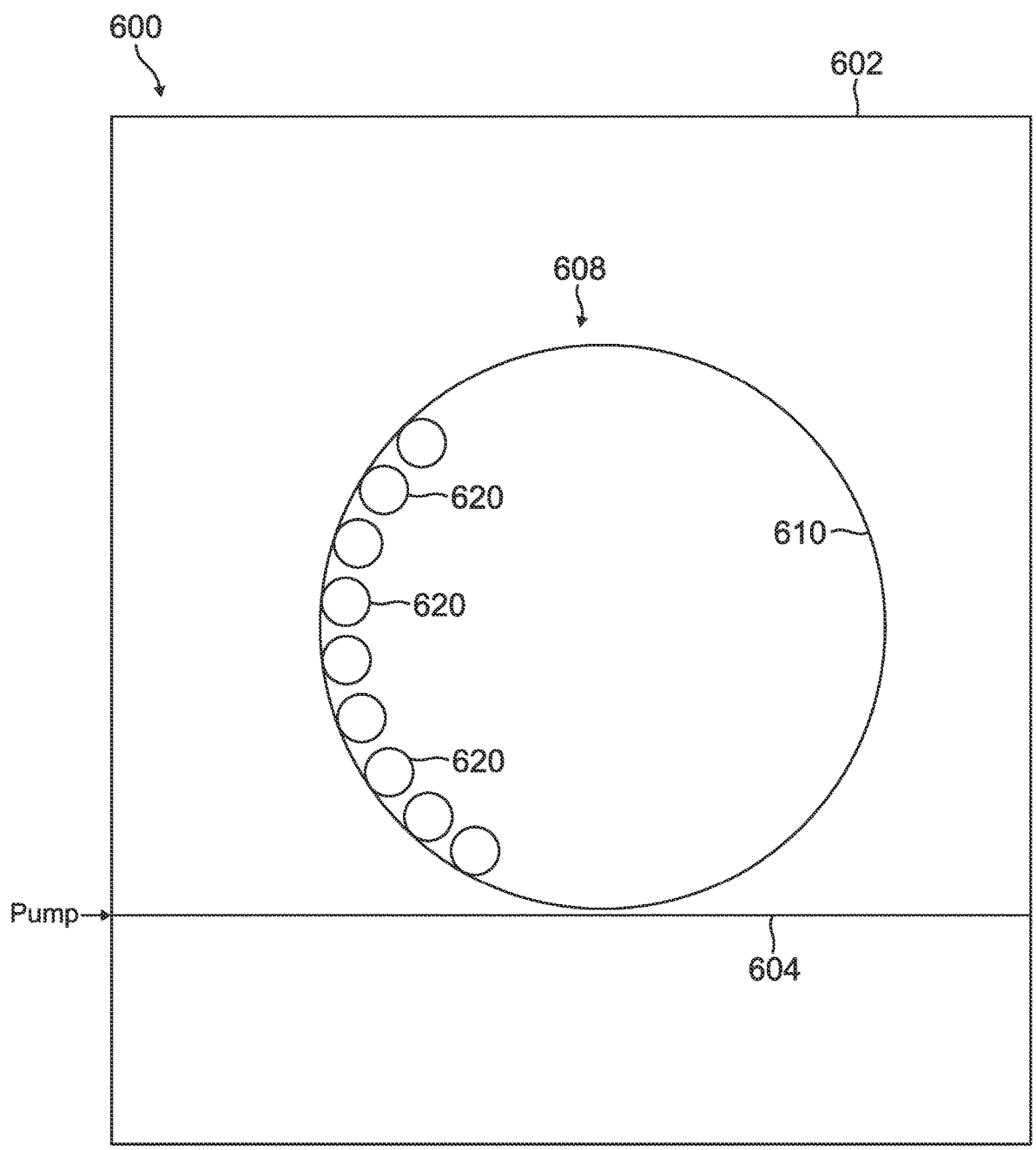
FIG. 6 is a schematic plan view of a Brillouin laser device, according to one embodiment.

FIG. 6 illustrates a Brillouin laser device 600, according to one embodiment. The Brillouin laser device 600 includes an integrated photonics chip 602, such as a silicon photonics chip. The photonics chip 602 comprises an optical waveguide bus 604, and an optical resonator 608 optically coupled to waveguide bus 604. The optical resonator 608 includes an outer waveguide ring resonator 610, and a plurality of inner waveguide ring resonators 620. The waveguide ring resonator 610 has a larger diameter and thus a longer length than each of waveguide ring resonators 620. In this embodiment, waveguide ring resonators 620 extend inside a perimeter defined by waveguide ring resonator 610. The waveguide ring resonators 620 are positioned to optically communicate with waveguide ring resonator 610. Additionally, optical resonator 608 can be embedded in one or more cladding layers, such as those described previously.

During operation, optical waveguide bus 604 is configured to receive light from a pump source, and to couple the light into waveguide ring resonator 610. The light in waveguide ring resonator 610 is then coupled into the waveguide ring resonators 620. When the an optical signal resonates within both waveguide ring resonator 610 and waveguide ring resonators 620, the resonance of waveguide ring resonator 610 is suppressed, which in turn suppresses or eliminates higher-order lasing in Brillouin laser device 600. The waveguide ring resonators 620 are designed such that their resonance overlaps with the $2^{nd}$ order SBS mode in waveguide ring resonator 610. Meanwhile, there are no overlaps between resonance modes of waveguide ring resonators 620 and the $1^{st}$ order SBS mode in waveguide ring resonator 610.

Figure 7:
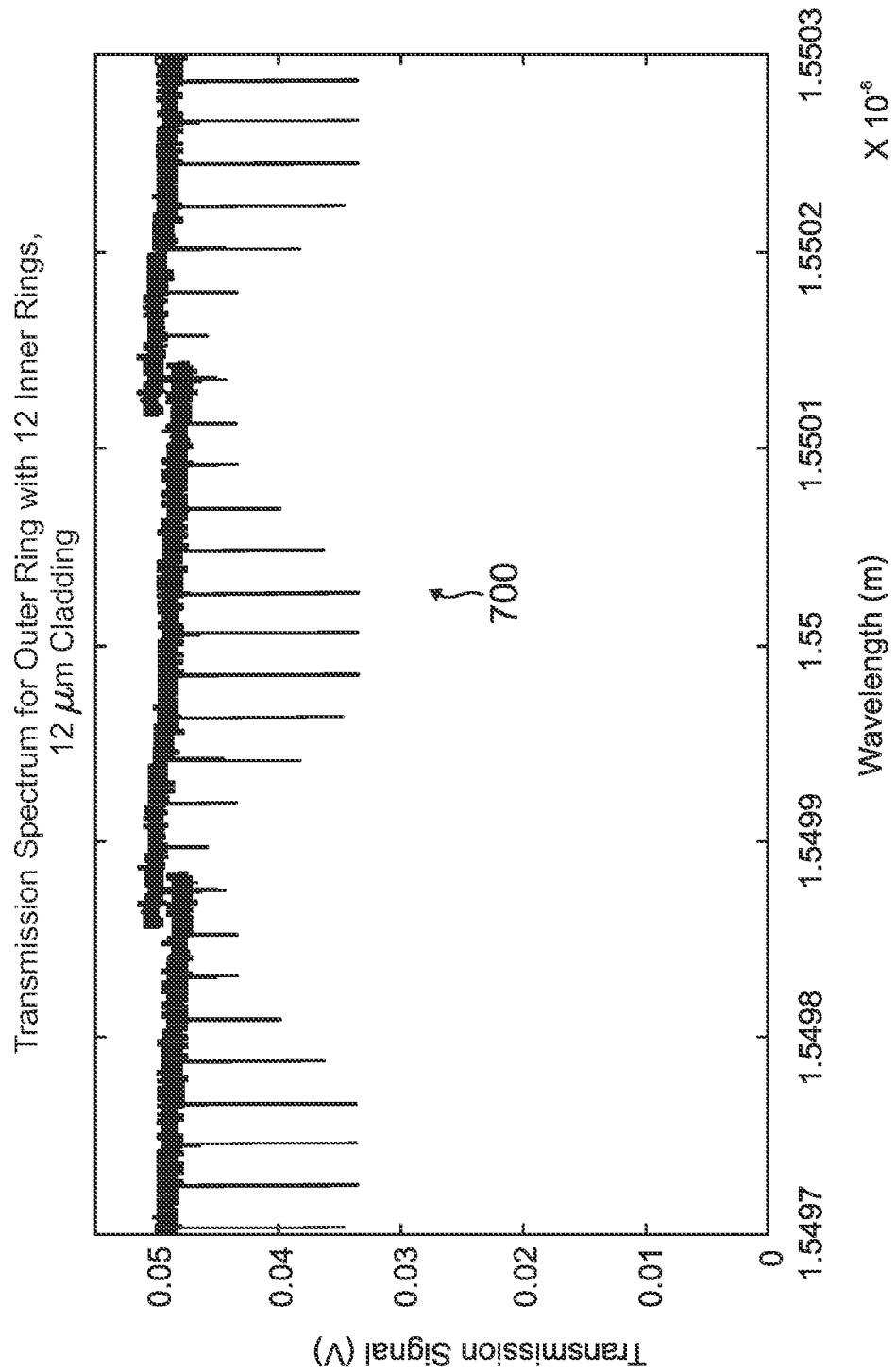
FIG. 7 is a graph of a modeled transmission spectrum for an optical resonator having a larger outer ring and twelve (12) smaller inner rings.

FIG. 7 is a graph of a modeled transmission spectrum 700 (e.g., at the output of waveguide bus 130, FIG. 1A) for an optical resonator having a larger outer ring and 12 smaller inner (nested) rings, such as optical resonator device 100 (FIG. 1A). The optical resonator is considered to have a 12 μm cladding. FIG. 7 plots the transmission signal with respect to wavelength, and highlights the periodicity of the transmission spectrum. In addition, FIG. 7 shows that there can be selective suppression of resonances in devices of this type.

Figure 8:
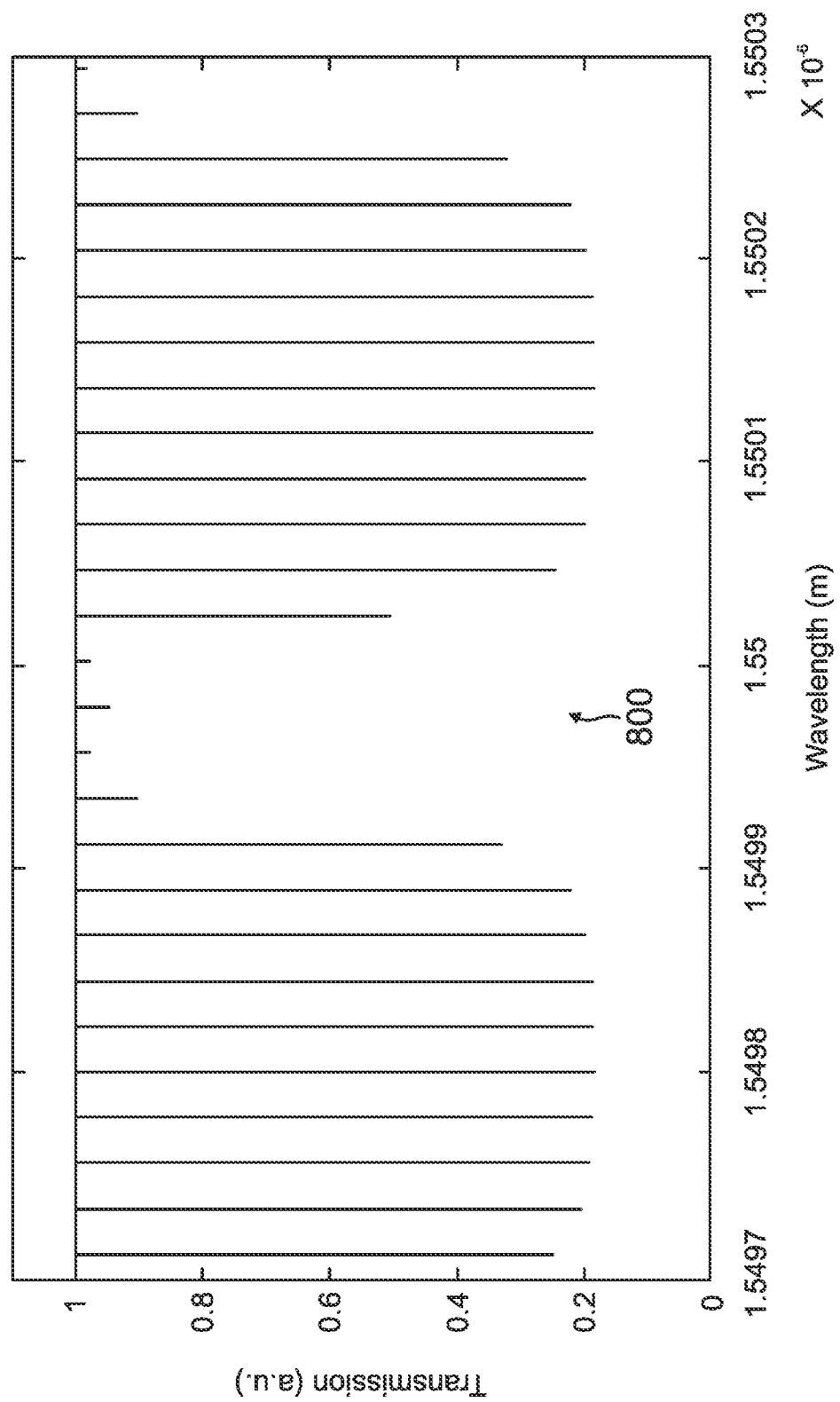
FIG. 8 is a graph of a transmission spectrum for an optical resonator having a larger outer ring and thirty-six (36) smaller inner rings.

FIG. 8 is a graph of a transmission spectrum 800 for an optical resonator having a larger outer ring and 36 smaller inner (nested) rings. FIG. 8 plots the transmission with respect to wavelength for this optical resonator, and highlights the suppression of certain resonant frequencies in the transmission spectrum. FIG. 8 shows that an optical resonator design can be made more robust to random variation in smaller ring resonance frequencies, by increasing the free spectral range (FSR) of the smaller inner rings (by reducing their radius) and increasing the number of smaller inner rings (e.g., from 12 to 36 in this example).

Figures 9, 10:
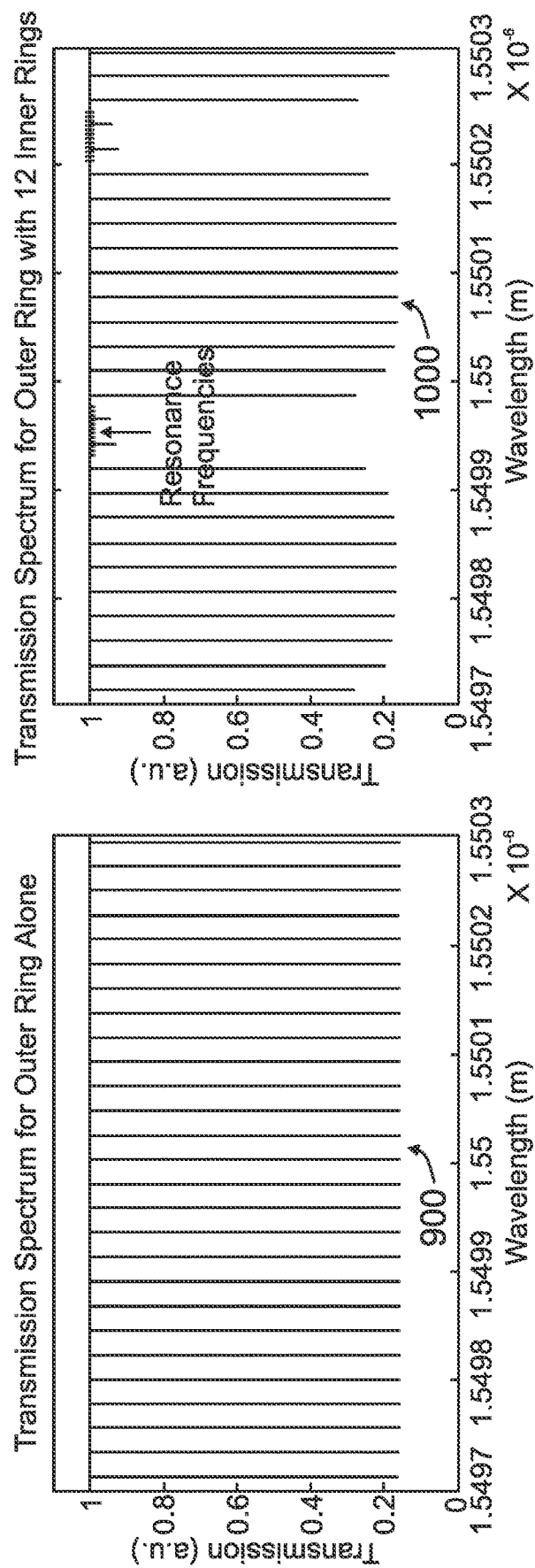
FIG. 9 is a graph of a theoretical simulation of a transmission spectrum for an optical resonator having a single outer ring alone, without any smaller inner rings.
FIG. 10 is a graph of a theoretical simulation of a transmission spectrum for an optical resonator having a larger outer ring and 12 smaller inner (nested) rings.

FIG. 9 is a graph of a theoretical simulation of a transmission spectrum 900 for an optical resonator having a single outer ring alone without any smaller inner rings. FIG. 9 plots the transmission signal with respect to wavelength, and shows a lack of suppression of resonant frequencies in the transmission spectrum when a single outer ring is used alone.

FIG. 10 is a graph of a theoretical simulation of a transmission spectrum 1000 for an optical resonator having a larger outer ring and 12 smaller inner (nested) rings, such as described previously (see FIG. 1A). FIG. 10 plots the transmission signal with respect to wavelength, and highlights the suppression of certain resonant frequencies in the transmission spectrum. In addition, FIG. 10 shows that the 12 inner rings did not increase the loss for the modes which do not overlap with inner ring resonances.

Example Embodiments

Example 1 includes an optical resonator device comprising: a first waveguide ring resonator having a first diameter; and one or more second waveguide ring resonators adjacent to the first waveguide ring resonator, the one or more second waveguide ring resonators each having a second diameter that is less than the first diameter; wherein the one or more second waveguide ring resonators optically communicate with the first waveguide ring resonator, such that an optical signal in the first waveguide ring resonator optically couples into the one or more second waveguide ring resonators; wherein the one or more second waveguide ring resonators is configured such that when the optical signal resonates within the first waveguide ring resonator and the one or more second waveguide ring resonators, the optical signal within the first waveguide ring resonator is suppressed.

Example 2 includes the optical resonator device Example 1, further comprising: a substrate layer including a bottom cladding layer that supports the first waveguide ring resonator; and an intermediate cladding layer over the first waveguide ring resonator and the bottom cladding layer, wherein the intermediate cladding layer supports the one or more second waveguide ring resonators.

Example 3 includes the optical resonator device Example 2, further comprising: a top cladding layer over the one or more second waveguide ring resonators and the intermediate cladding layer.

Example 4 includes the optical resonator device of any of Examples 2-3, wherein the substrate layer is coupled to a photonics chip.

Example 5 includes the optical resonator device of Example 1, further comprising: a substrate layer including a bottom cladding layer that supports the one or more second waveguide ring resonators; and an intermediate cladding layer over the one or more second waveguide ring resonators and the bottom cladding layer, wherein the intermediate cladding layer supports the first waveguide ring resonator.

Example 6 includes the optical resonator device Example 5, further comprising: a top cladding layer over the first waveguide ring resonator and the intermediate cladding layer.

Example 7 includes the optical resonator device of any of Examples 5-6, wherein the substrate layer is coupled to a photonics chip.

Example 8 includes the optical resonator device of any of Examples 1-7, wherein the first waveguide ring resonator defines a perimeter, and the one or more second waveguide ring resonators extend inside the perimeter.

Example 9 includes the optical resonator device of any of Examples 1-7, wherein the first waveguide ring resonator defines a perimeter, and the one or more second waveguide ring resonators extend outside the perimeter.

Example 10 includes a method of fabricating an optical resonator device, the method comprising: providing a substrate layer comprising a bottom cladding layer that includes a first material having a first refractive index; depositing a first waveguide layer over the bottom cladding layer, the first waveguide layer including a second material having a second refractive index that is greater than the first refractive index; forming at least one first waveguide ring resonator from the first waveguide layer, the at least one first waveguide ring resonator having a first diameter; depositing an intermediate cladding layer over the at least one first waveguide ring resonator and exposed portions of the bottom cladding layer, the intermediate cladding layer including the first material; depositing a second waveguide layer over the intermediate cladding layer, the second waveguide layer including the second material; and forming at least one second waveguide ring resonator from the second waveguide layer, the at least one second waveguide ring resonator having a second diameter that is different from the first diameter; wherein the at least one first waveguide ring resonator optically communicates with the at least one second waveguide ring resonator.

Example 11 includes the method of Example 10, wherein the first diameter of the at least one first waveguide ring resonator is greater than the second diameter of the at least one second waveguide ring resonator.

Example 12 includes the method of Example 11, wherein: the at least one first waveguide ring resonator is formed as a single waveguide ring resonator; and the at least one second waveguide ring resonator is formed as a plurality of waveguide ring resonators; wherein the plurality of waveguide ring resonators is formed such that when an optical signal resonates within the single waveguide ring resonator and the plurality of waveguide ring resonators, a resonance of the single waveguide ring resonator is suppressed.

Example 13 includes the method of Example 10, wherein the first diameter of the at least one first waveguide ring resonator is less than the second diameter of the at least one second waveguide ring resonator.

Example 14 includes the method of Example 13, wherein: the at least one first waveguide ring resonator is formed as a plurality of waveguide ring resonators; and the at least one second waveguide ring resonator is formed as a single waveguide ring resonator; wherein the plurality of waveguide ring resonators is formed such that when an optical signal resonates within the single waveguide ring resonator and the plurality of waveguide ring resonators, a resonance of the single waveguide ring resonator is suppressed.

Example 15 includes the method of any of Examples 10-14, further comprising: forming a top cladding layer over the at least one second waveguide ring resonator and exposed portions of the intermediate cladding layer, the top cladding layer including the first material.

Example 16 includes the method of Example 15, wherein: the bottom cladding layer has a thickness of about 5 microns to about 10 microns; the intermediate cladding layer has a thickness of about 1 micron to about 5 microns; the top cladding layer has a thickness of about 5 microns to about 10 microns; and the waveguide ring resonators each have a thickness of about 25 nm to about 500 nm.

Example 17 includes the method of any of Examples 10-16, wherein: the first material comprises silicon dioxide, aluminum oxide, or silicon oxynitride; and the second material comprises silicon nitride, silicon, or titanium dioxide.

Example 18 includes the method of any of Examples 10-17, wherein the substrate layer is formed on a photonics chip.

Example 19 includes a Brillouin laser device, comprising: a photonics chip comprising: an optical waveguide bus; and an optical resonator device optically coupled to the optical waveguide bus, the optical resonator device comprising: a first waveguide ring resonator having a first diameter; and one or more second waveguide ring resonators adjacent to the first waveguide ring resonator, the one or more second waveguide ring resonators each having a second diameter that is less than the first diameter; wherein the optical waveguide bus is configured to receive an optical signal and couple the optical signal into the first waveguide ring resonator; wherein the one or more second waveguide ring resonators optically communicate with the first waveguide ring resonator, such that the optical signal in the first waveguide ring resonator is coupled into the one or more second waveguide ring resonators; wherein the one or more second waveguide ring resonators is configured such that when the optical signal resonates within the first waveguide ring resonator and the one or more second waveguide ring resonators, a resonance of the first waveguide ring resonator is suppressed, thereby suppressing higher-order lasing in the Brillouin laser device.

Example 20 includes the Brillouin laser device of Example 19, wherein the optical resonator device is embedded in one or more cladding layers.

From the foregoing, it will be appreciated that, although specific embodiments have been described herein for purposes of illustration, various modifications may be made without deviating from the scope of the disclosure. Thus, the described embodiments are to be considered in all respects only as illustrative and not restrictive. In addition, all changes that come within the meaning and range of equivalency of the claims are to be embraced within their scope.

What is claimed is:

1. An optical resonator device comprising:
a first waveguide ring resonator having a first diameter; and
a plurality of second waveguide ring resonators adjacent to the first waveguide ring resonator, the second waveguide ring resonators each having a second diameter that is less than the first diameter;
wherein the second waveguide ring resonators optically communicate with the first waveguide ring resonator, such that an optical signal in the first waveguide ring resonator optically couples into the second waveguide ring resonators;
wherein the second waveguide ring resonators are configured such that when the optical signal resonates within the first waveguide ring resonator and the second waveguide ring resonators, the optical signal within the first waveguide ring resonator is suppressed.

2. The optical resonator device claim 1, further comprising:
a substrate layer including a bottom cladding layer that supports the first waveguide ring resonator; and
an intermediate cladding layer over the first waveguide ring resonator and the bottom cladding layer, wherein the intermediate cladding layer supports the second waveguide ring resonators.

3. The optical resonator device claim 2, further comprising:
a top cladding layer over the second waveguide ring resonators and the intermediate cladding layer.

4. The optical resonator device of claim 2, wherein the substrate layer is coupled to a photonics chip.

5. The optical resonator device claim 1, further comprising:
a substrate layer including a bottom cladding layer that supports the second waveguide ring resonators; and
an intermediate cladding layer over the second waveguide ring resonators and the bottom cladding layer, wherein the intermediate cladding layer supports the first waveguide ring resonator.

6. The optical resonator device claim 5, further comprising:
a top cladding layer over the first waveguide ring resonator and the intermediate cladding layer.

7. The optical resonator device of claim 5, wherein the substrate layer is coupled to a photonics chip.

8. The optical resonator device of claim 1, wherein the first waveguide ring resonator defines a perimeter, and the second waveguide ring resonators extend inside the perimeter.

9. The optical resonator device of claim 1, wherein the first waveguide ring resonator defines a perimeter, and the second waveguide ring resonators extend outside the perimeter.

10. A method of fabricating an optical resonator device, the method comprising:
providing a substrate layer comprising a bottom cladding layer that includes a first material having a first refractive index;
depositing a first waveguide layer over the bottom cladding layer, the first waveguide layer including a second material having a second refractive index that is greater than the first refractive index;
forming at least one first waveguide ring resonator from the first waveguide layer, the at least one first waveguide ring resonator having a first diameter;
depositing an intermediate cladding layer over the at least one first waveguide ring resonator and exposed portions of the bottom cladding layer, the intermediate cladding layer including the first material;
depositing a second waveguide layer over the intermediate cladding layer, the second waveguide layer including the second material; and
forming at least one second waveguide ring resonator from the second waveguide layer, the at least one second waveguide ring resonator having a second diameter that is different from the first diameter;

wherein the at least one first waveguide ring resonator optically communicates with the at least one second waveguide ring resonator.

11. The method of claim 10, wherein the first diameter of the at least one first waveguide ring resonator is greater than the second diameter of the at least one second waveguide ring resonator.

12. The method of claim 11, wherein:
the at least one first waveguide ring resonator is formed as a single waveguide ring resonator; and
the at least one second waveguide ring resonator is formed as a plurality of waveguide ring resonators;
wherein the plurality of waveguide ring resonators is formed such that when an optical signal resonates within the single waveguide ring resonator and the plurality of waveguide ring resonators, a resonance of the single waveguide ring resonator is suppressed.

13. The method of claim 10, wherein the first diameter of the at least one first waveguide ring resonator is less than the second diameter of the at least one second waveguide ring resonator.

14. The method of claim 13, wherein:
the at least one first waveguide ring resonator is formed as a plurality of waveguide ring resonators; and
the at least one second waveguide ring resonator is formed as a single waveguide ring resonator;
wherein the plurality of waveguide ring resonators is formed such that when an optical signal resonates within the single waveguide ring resonator and the plurality of waveguide ring resonators, a resonance of the single waveguide ring resonator is suppressed.

15. The method of claim 10, further comprising:
forming a top cladding layer over the at least one second waveguide ring resonator and exposed portions of the intermediate cladding layer, the top cladding layer including the first material.

16. The method of claim 15, wherein:
the bottom cladding layer has a thickness of about 5 microns to about 10 microns;
the intermediate cladding layer has a thickness of about 1 micron to about 5 microns;
the top cladding layer has a thickness of about 5 microns to about 10 microns; and
the waveguide ring resonators each have a thickness of about 25 nm to about 500 nm.

17. The method of claim 10, wherein:
the first material comprises silicon dioxide, aluminum oxide, or silicon oxynitride; and
the second material comprises silicon nitride, silicon, or titanium dioxide.

18. The method of claim 10, wherein the substrate layer is formed on a photonics chip.

19. A Brillouin laser device, comprising:
a photonics chip comprising:
an optical waveguide bus; and
an optical resonator device optically coupled to the optical waveguide bus, the optical resonator device comprising:
a first waveguide ring resonator having a first diameter; and
one or more second waveguide ring resonators adjacent to the first waveguide ring resonator, the one or more second waveguide ring resonators each having a second diameter that is less than the first diameter;
wherein the optical waveguide bus is configured to receive an optical signal and couple the optical signal into the first waveguide ring resonator;
wherein the one or more second waveguide ring resonators optically communicate with the first waveguide ring resonator, such that the optical signal in the first waveguide ring resonator is coupled into the one or more second waveguide ring resonators;
wherein the one or more second waveguide ring resonators is configured such that when the optical signal resonates within the first waveguide ring resonator and the one or more second waveguide ring resonators, a resonance of the first waveguide ring resonator is suppressed, thereby suppressing higher-order lasing in the Brillouin laser device without substantially increasing a threshold of first-order stimulated Brillouin scattering (SBS).

20. The Brillouin laser device of claim 19, wherein the optical resonator device is embedded in one or more cladding layers.

* * * * *